(12) United States Patent
Woo et al.

(10) Patent No.: US 12,089,460 B2
(45) Date of Patent: Sep. 10, 2024

(54) DISPLAY DEVICE

(71) Applicant: LG Display Co., Ltd., Seoul (KR)

(72) Inventors: Seonghwan Woo, Paju-si (KR); Junggyu Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/063,456

(22) Filed: Dec. 8, 2022

(65) Prior Publication Data

US 2023/0209936 A1   Jun. 29, 2023

(30) Foreign Application Priority Data

Dec. 29, 2021   (KR) .......................... 10-2021-0191553

(51) Int. Cl.
*H10K 59/131* (2023.01)
*G09G 3/3266* (2016.01)

(52) U.S. Cl.
CPC ......... *H10K 59/131* (2023.02); *G09G 3/3266* (2013.01); *G09G 2300/0413* (2013.01); *G09G 2300/0426* (2013.01); *G09G 2310/0291* (2013.01); *G09G 2320/0223* (2013.01)

(58) Field of Classification Search
CPC ............... H10K 59/131; G09G 3/3266; G09G 2310/0291; G09G 2320/0223; G11C 19/28
See application file for complete search history.

(56) References Cited

U.S. PATENT DOCUMENTS

| | | | |
|---|---|---|---|
| 11,176,892 B2* | 11/2021 | Jung | .................... G09G 3/3233 |
| 2018/0204889 A1* | 7/2018 | Yu | ........................ H10K 59/131 |
| 2020/0058242 A1* | 2/2020 | Liu | ..................... H01L 27/1214 |
| 2020/0394963 A1 | 12/2020 | Jung et al. | |
| 2021/0151542 A1* | 5/2021 | Choe | ................. H10K 59/1216 |

FOREIGN PATENT DOCUMENTS

KR   10-2019-0121419 A   10/2019

* cited by examiner

*Primary Examiner* — Sardis F Azongha
(74) *Attorney, Agent, or Firm* — Seed IP Law Group LLP

(57) ABSTRACT

A display apparatus comprises a substrate including a display area and a non-display area adjacent to the display area, a plurality of pixels disposed in the display area, a gate driver disposed on both sides of the display area in the non-display area, the gate driver comprising a plurality of stages including a first stage and a second stage, and a plurality of gate lines extending from the gate driver to the display area, wherein the plurality of gate lines include a first gate line including a linear portion and coupled to the first stage, and a second gate line including a linear portion and a curved portion and coupled to the second stage, and wherein a size of the second stage may be larger than a size of the first stage.

19 Claims, 11 Drawing Sheets

DISPLAY DEVICE

CROSS-REFERENCE TO RELATED APPLICATIONS

This application claims the benefit and priority of Korean Patent Application No. 10-2021-0191553 filed on Dec. 29, 2021, in the Korean Intellectual Property Office, the disclosure of which is incorporated herein by reference.

BACKGROUND

Technical Field

The present disclosure relates to a display apparatus, and more particularly, to a display apparatus which is capable of reducing or minimizing RC delay for a gate signal.

Description of the Related Art

Currently, as it enters a full-scale information era, a field of a display apparatus which visually expresses electrical information signals has been rapidly developed and studies are continued to improve performances of various display apparatuses such as thin-thickness, light weight, and low power consumption.

A representative display apparatus may include a liquid crystal display apparatus (LCD), a field emission display apparatus (FED), an electro-wetting display apparatus (EWD), an organic light emitting display apparatus (OLED), and the like.

Among them, an electroluminescent display apparatus including an organic light emitting display device is a self-emitting display apparatus so that a separate light source is not necessary, which is different from a liquid crystal display apparatus. Therefore, the electroluminescent display apparatus may be manufactured to have a light weight and a small thickness. Further, since the electroluminescent display apparatus is advantageous not only in terms of power consumption due to the low voltage driving, but also in terms of color implementation, a response speed, a viewing angle, a contrast ratio (CR), it is expected to be utilized in various fields.

BRIEF SUMMARY

One or more embodiments of the present disclosure provide a display apparatus which reduces or minimizes the RC delay variation due to a difference in a length of a gate line.

One or more embodiments of the present disclosure provide a display apparatus which relieves the RC delay for a scan signal in a gate line having a curved portion to improve the spot generated in an image.

The technical benefits of the present disclosure are not limited to the above-mentioned benefits, and other benefits, which are not mentioned above, can be clearly understood by those skilled in the art from the following descriptions.

A display apparatus according to an aspect of the present disclosure comprises a substrate including a display area and a non-display area adjacent to the display area, a plurality of pixels disposed in the display area, a gate driver disposed on both sides of the display area in the non-display area, the gate driver comprising a plurality of stages including a first stage and a second stage, and a plurality of gate lines extending from the gate driver to the display area, wherein the plurality of gate lines include a first gate line including a linear portion and connected to the first stage, and a second gate line including a linear portion and a curved portion and connected to the second stage, and wherein a size of the second stage may be larger than a size of the first stage.

Other detailed matters of the embodiments are included in the detailed description and the drawings.

According to the present disclosure, an RC delay variation between a gate line having only a linear portion and a gate line having a linear portion and a curved portion can be reduced.

According to the present disclosure, a sampling time for a scan signal is sufficiently ensured to improve a problem of the spot generated in the image.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
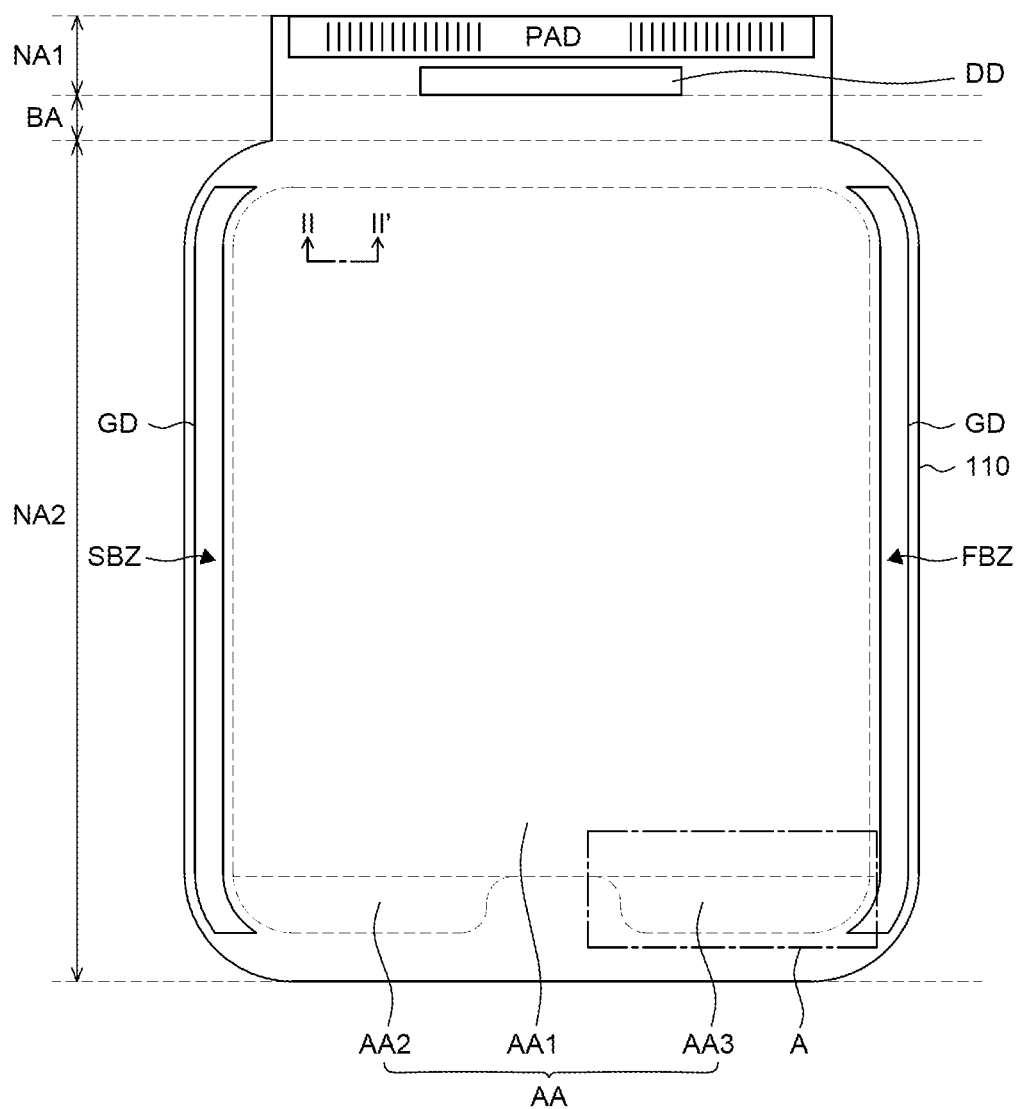
FIG. 1 is a schematic plan view of a display apparatus according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

FIG. 1 is a schematic plan view of a display apparatus according to an embodiment of the present disclosure; In FIG. 1, for the convenience of description, among various components of the display apparatus 100, only a substrate 110, a pad part PAD, and a data driver DD are illustrated.

Referring to FIG. 1, the substrate 110 includes a display area AA and a non-display area NA.

The substrate 110 is a base member for supporting various components of the display apparatus 100 and may be configured by an insulating material. For example, the substrate 110 may be configured by glass or a plastic material such as polyimide.

In the display area AA, images are displayed and a plurality of pixels is disposed. In the display area AA, the display elements for displaying images and driving parts for driving the display elements may be disposed. For example, when the display apparatus 100 is an organic light emitting display apparatus, the display element may be an organic light emitting device which includes an anode, an organic layer, and a cathode. The driving parts may be configured by various components for driving the organic light emitting device, such as a power line, a gate line, a data line, a transistor, and a storage capacitor. Hereinafter, for the convenience of description, it is assumed that the display apparatus 100 is an organic light emitting display apparatus, but the display apparatus 100 is not limited to the organic light emitting display apparatus.

Referring to FIG. 1, the substrate 100 may have a corner area having a different shape and the display area AA may have a shape corresponding to the corner area having a different shape of the substrate 110. The corners of the substrate 110 and the display area AA may have a round shape. However, the present disclosure is not limited thereto and the substrate 110 and the display area AA may have various shapes suitable for a design of an electronic device in which the display apparatus 100 is mounted.

The display area AA includes a first display area AA1, a second display area AA2, and a third display area AA3. The first display area AA1 is an area which is located in an upper portion and a center portion of the display area AA with respect to FIG. 1. The second display area AA2 and the third display area AA3 are areas which extend from one side of the first display area AA1 and are spaced apart from each other. Therefore, the non-display area NA, specifically, a second non-display area NA2 is disposed between the second display area AA2 and the third display area AA3. The second display area AA2 and the third display area AA3 may be disposed so as to correspond to some corner areas among a plurality of corner areas. A structure having a shape of the display area AA as described above may be referred to as a notch structure.

In the non-display area NA, an image is not displayed and various wiring lines and circuits for driving a display element of the display area AA are disposed. For example, in the non-display area NA, a data driver DD, a gate driver GD, a link line, a pad part PAD, and the like may be disposed.

The non-display area NA may be an area extending from the display area AA, but is not limited thereto and may be an area enclosing the display area AA.

The non-display area NA includes a first non-display area NA1, a bending area BA, and a second non-display area NA2. The second non-display area NA2 extends from the display area AA. The bending area BA may extend from the second non-display area NA2 and may be bent. The first non-display NA1 extends from the bending area BA.

In the first non-display area NA1, a data driver DD, a pad part PAD, and the like may be disposed. In the pad part PAD, various signal lines or pads connected to a PCB are disposed. In the pad part PAD, a power supply pad, a data pad, a gate pad, and the like may be disposed.

The data driver DD is mounted in or connected to a separate PCB to be connected to the display panel by means of the pad part PAD or mounted or connected between the pad part PAD and the display area AA in the form of chip on panel (COP). The data driver DD includes at least one source drive IC (integrated circuit). The at least one source drive IC is supplied with digital video data and a source timing control signal from a timing controller. At least one source drive IC converts digital video data into a gamma voltage to generate a data voltage in response to the source timing control signal and supplies the data voltage through the data line of the display area AA.

In the bending area BA, a plurality of bending patterns is disposed. The bending area BA is an area which is bent on a final product so that as the bending area BA is bent, a crack may be caused due to a stress concentrated on the bending pattern disposed in the bending area BA. Therefore, in order to reduce or minimize the crack, the bending pattern may be formed of a pattern having a specific shape. For example, the bending pattern may be a pattern in which conductive patterns having at least one of a diamond shape, a rhombus shape, a zigzag pattern, and a circular shape are repeatedly disposed. In addition to the above-mentioned shape, the bending pattern may have any other shape which may reduce or minimize the stress concentrated on the bending pattern or the crack, but is not limited thereto.

The second non-display area NA2 is an area which encloses an area between the bending area BA and the display area AA and the display area AA and a link line such as a power link line, a data link line may be disposed therein. That is, the second non-display area NA2 serves to transmit a signal output from a driver to the display area AA. When the substrate 110 includes a corner area having a different shape, the second non-display area NA2 may have a shape corresponding to the shape of the substrate 110 and the display area AA.

The gate driver GD may be disposed on both sides of the display area AA in the second non-display area NA2 of the non-display area NA. The gate driver GD may be implemented by a gate in panel (GIP), but is not limited thereto. The gate driver GD will be described below in more detail with reference to FIGS. 3 to 6.

Figure 2:
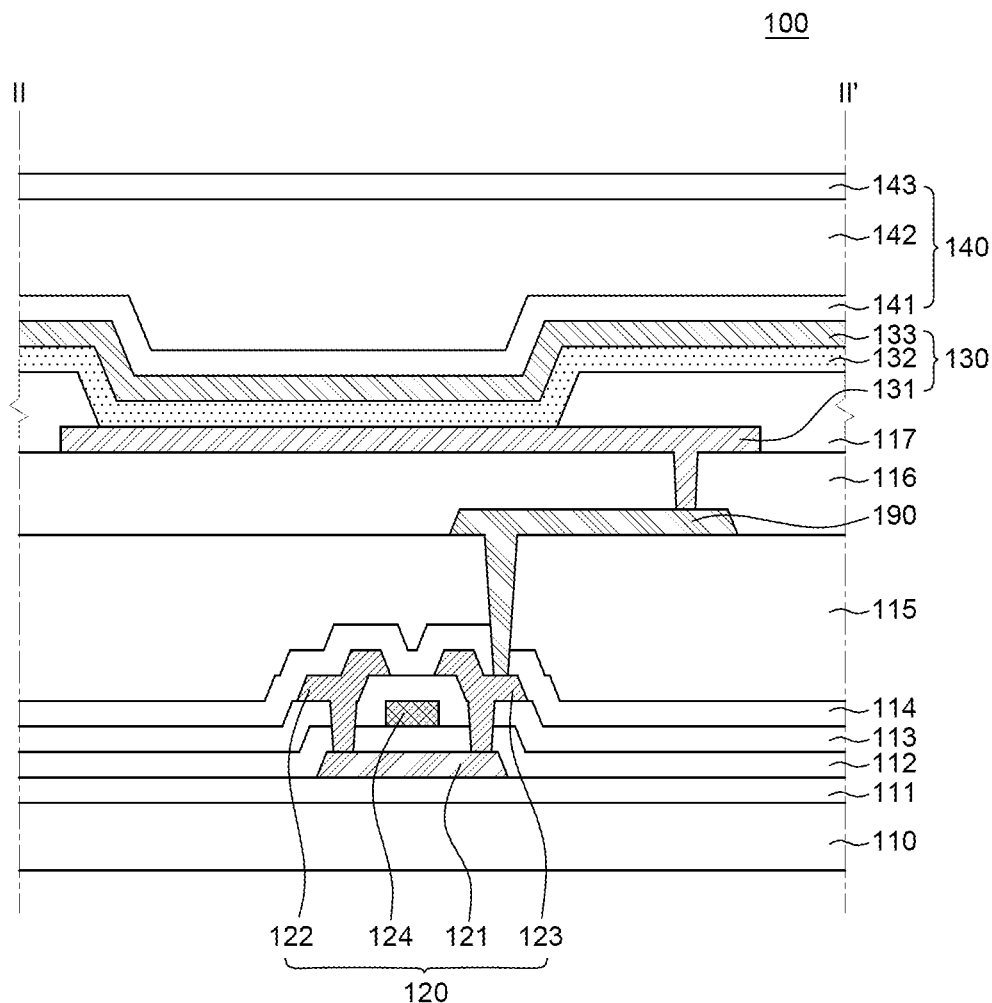
FIG. 2 is a cross-sectional view taken along the line II-II' of FIG. 1.

First, FIG. 2 will be referenced for more detailed description of a plurality of pixels of the display apparatus 100.

FIG. 2 is a cross-sectional view taken along the line II-II' of FIG. 1.

Referring to FIG. 2, the display apparatus 100 according to the embodiment of the present disclosure is a top emission type display apparatus. The display apparatus 100 may include a substrate 110, a buffer layer 111, a transistor 120, a gate insulating layer 112, an interlayer insulating layer 113, a passivation layer 114, a first planarizing layer 115, a connection electrode 190, a second planarizing layer 116, a bank 117, a light emitting device 130, and an encapsulating part 140.

The substrate 110 may support various components of the display apparatus 100. The substrate 110 may be formed of a glass or a plastic material having flexibility. When the substrate 110 is formed of a plastic material, for example, the substrate may be formed of polyimide (PI).

The buffer layer (or insulation layer) 111 may be disposed on the substrate 110. The buffer layer 111 may be formed by a single layer of silicon nitride SiNx or silicon oxide SiOx or a multi-layer thereof. The buffer layer 111 may serve to improve adhesiveness between layers formed on the buffer layer 111 and the substrate 110 and block alkali components leaked from the substrate 110.

The transistor 120 may be disposed on the buffer layer 111. The transistor 120 may include an active layer 121, a gate electrode 124, a source electrode 122, and a drain electrode 123. Here, depending on the design of the pixel circuit, the source electrode 122 may serve as a drain electrode and the drain electrode 123 may serve as a source electrode. The active layer 121 of the transistor 120 may be disposed on the buffer layer 111.

The active layer 121 may be formed of various materials such as polysilicon, amorphous silicon, or oxide semiconductor. The active layer 121 may include a channel region in which a channel is formed when the transistor 120 is driven and a source region and a drain region on both sides of the channel region. The source region refers to a portion of the active layer 121 which is connected to the source electrode 122 and the drain region refers to a portion of the active layer 121 which is connected to the drain electrode 123.

The gate insulating layer 112 may be disposed on the active layer 121 of the transistor 120. The gate insulating layer 112 may be formed as a single layer of silicon nitride SiNx or silicon oxide SiOx or a multi-layer thereof. In the gate insulating layer 112, a contact hole through which the source electrode 122 and the drain electrode 123 of the transistor 120 are connected to the source region and the drain region of the active layer 121 of the transistor 120 may be formed.

The gate electrode 124 of the transistor 120 may be disposed on the gate insulating layer 112. The gate electrode 124 may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The gate electrode 124 may be formed on the gate insulating layer 112 so as to overlap the channel region of the active layer 121 of the transistor 120.

The interlayer insulating layer (or insulating layer) 113 may be disposed on the gate insulating layer 112 and the gate electrode 124. The interlayer insulating layer 113 may be formed as a single layer of silicon nitride SiNx or silicon oxide SiOx or a multi-layer thereof. A contact hole through which the source region and the drain region of the active layer 121 of the transistor 120 are exposed may be formed in the interlayer insulating layer 113.

The source electrode 122 and the drain electrode 123 of the transistor 120 may be disposed on the interlayer insulating layer 113.

The source electrode 122 and the drain electrode 123 of the transistor 120 may be connected to the active layer 121 of the transistor 120 through the contact holes formed in the gate insulating layer 112 and the interlayer insulating layer 113. Therefore, the source electrode 122 of the transistor 120 may be connected to the source region of the active layer 121 through the contact holes formed in the gate insulating layer 112 and the interlayer insulating layer 113. Further, the drain electrode 123 of the transistor 120 may be connected to the drain region of the active layer 121 through the contact holes formed in the gate insulating layer 112 and the interlayer insulating layer 113.

The source electrode 122 and the drain electrode 123 of the transistor 120 may be formed by the same process. Further, the source electrode 122 and the drain electrode 123 of the transistor 120 may be formed of the same material. The source electrode 122 and the drain electrode 123 of the transistor 120 may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof.

The passivation layer (or insulating layer) 114 may be disposed on the source electrode 122 and the drain electrode 123 to protect the source electrode 122 and the drain electrode 123. The passivation layer 114 is an insulating layer for protecting components below the passivation layer 114. For example, the passivation layer 114 may be configured by a single layer or a double layer of silicon oxide SiOx or silicon nitride SiNx, but is not limited thereto. Further, the passivation layer 114 may be omitted depending on the embodiment.

The first planarizing layer (or insulating layer) 115 may be disposed on the transistor 120 and the passivation layer 114. As illustrated in FIG. 3, a contact hole may be formed in the first planarizing layer 115 to expose the drain electrode 123. The first planarizing layer 115 may be an organic material layer which planarizes an upper portion of the transistor 120. For example, the first planarizing layer 115 may be formed of an organic material such as acryl resin, epoxy resin, phenolic resin, polyamide resin, or polyimide resin. However, it is not limited thereto and the first planarizing layer 115 may be an inorganic material layer for protecting the transistor 120. For example, the first planarizing layer 115 may be formed of an inorganic material such as silicon nitride (SiNx) or silicon oxide (SiOx). The first planarizing layer 115 may be configured by a single layer of silicon nitride (SiNx) or silicon oxide (SiOx) or a multi-layer thereof.

The connection electrode 190 may be disposed on the first planarizing layer 115. Further, the connection electrode 190 may be connected to the drain electrode 123 of the transistor 120 through the contact holes of the first planarizing layer 115. The connection electrode 190 may serve to electrically connect the transistor 120 and the light emitting device 130. For example, the connection electrode 190 may serve to electrically connect the drain electrode 123 of the transistor 120 and the first electrode 131 of the light emitting device 130. The connection electrode 190 may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The connection electrode 190 may be formed of the same material as the source electrode 122 and the drain electrode 123 of the transistor 120.

The second planarizing layer (or insulating layer) 116 may be disposed on the connection electrode 190 and the first planarizing layer 115. Further, as illustrated in FIG. 3, a contact hole may be formed in the second planarizing layer 116 to expose the connection electrode 190. The second planarizing layer 116 may be an organic material layer which planarizes an upper portion of the transistor 120. For example, the second planarizing layer 116 may be formed of an organic material such as acryl resin, epoxy resin, phenolic resin, polyamide resin, or polyimide resin.

In each of the plurality of pixels, the light emitting device 130 may be disposed on the second planarizing layer 116. The light emitting device 130 may include a first electrode 131 which is an anode, a light emitting structure 132, and a second electrode 133 which is a cathode. The first electrode 131 of the light emitting device 130 may be disposed on the second planarizing layer 116. The first electrode 131 may be electrically connected to the connection electrode 190 through the contact hole formed in the second planarizing layer 116. Therefore, the first electrode 131 of the light emitting device 130 is electrically connected to the connection electrode 190 through the contact hole formed in the second planarizing layer 116 to be electrically connected to the transistor 120.

The first electrode 131 which is an anode may be formed to have a multi-layered structure including a transparent conductive layer and an opaque conductive layer having high reflection efficiency. The transparent conductive layer may be formed of a material having a high work function such as indium tin oxide (ITO) or indium zinc oxide (IZO). The opaque conductive layer may be formed to have a single layer or a multi-layered structure including aluminum (Al), silver (Ag), copper (Cu), lead (Pb), molybdenum (Mo), and titanium (Ti), or an alloy thereof. For example, the first electrode 131 may be formed to have a structure in which a transparent conductive layer, an opaque conductive layer, and a transparent conductive layer are sequentially laminated. However, the first electrode 131 is not limited thereto but may also be formed to have a structure in which the transparent conductive layer and the opaque conductive layer are sequentially laminated.

The bank 117 may be disposed on the first electrode 131 and the second planarizing layer 116. An opening may be formed in the bank 117 to expose the first electrode 131. Since the bank 117 defines an emission area of the display apparatus 100, the bank 117 may also be referred to as a pixel definition layer.

An emission structure 132 including an emission layer may be disposed on the first electrode 131.

The emission structure 132 of the light emitting device 130 may be formed such that a hole layer, a light emitting layer, and an electron layer are laminated on the first electrode 131 in this order or a reverse order. In addition, the emission structure 132 may include first and second emission structures which are opposite to each other with a charge generating layer therebetween. In this case, any one emission layer of the first and second emission structures generates blue light and the other one emission layer of the first and second emission structures generates yellow-green light so that white light may be generated by the first and the second emission structures. The white light generated in the emission structure 132 is incident onto a color filter disposed above the emission structure 132 to implement color images. In addition, individual emission structures 132 generate color light corresponding to individual sub pixels without having separate color filters to implement color images. For example, the emission structure 132 of a red sub pixel generates red light, the emission structure 132 of a green sub pixel generates green light, and the emission structure 132 of a blue sub pixel may generate blue light.

The second electrode 133 which is a cathode may be further disposed on the emission structure 132. Since the display apparatus 100 is a top emission type display apparatus, the second electrode 133 may be formed of a metal material having a very thin thickness or formed of a transparent conductive material. The second electrode 133 of the light emitting device 130 may be disposed on the emission structure 132 so as to be opposite to the first electrode 131 with the emission structure 132 therebetween. In the display apparatus 100 according to the embodiment of the present disclosure, the second electrode 133 may be a cathode electrode. The encapsulating part 140 may be further disposed on the second electrode 133 to suppress moisture permeation.

The encapsulating part 140 may include a first inorganic encapsulating layer 141, an organic encapsulating layer 142, and a second inorganic encapsulating layer 143. The first inorganic encapsulating layer 141 of the encapsulating part 140 may be disposed on the second electrode 133. Further, the organic encapsulating layer 142 may be disposed on the first inorganic encapsulating layer 141. Further, the second inorganic encapsulating layer 143 may be disposed on the organic encapsulating layer 142. The first inorganic encapsulating layer 141 and the second inorganic encapsulating layer 143 of the encapsulating part 140 may be formed of an inorganic material such as silicon nitride SiNx or silicon oxide SiOx. The organic encapsulating layer 142 of the encapsulating part 140 may be formed of an organic material such as acryl resin, epoxy resin, phenolic resin, polyamide resin, or polyimide resin.

Figure 3A:
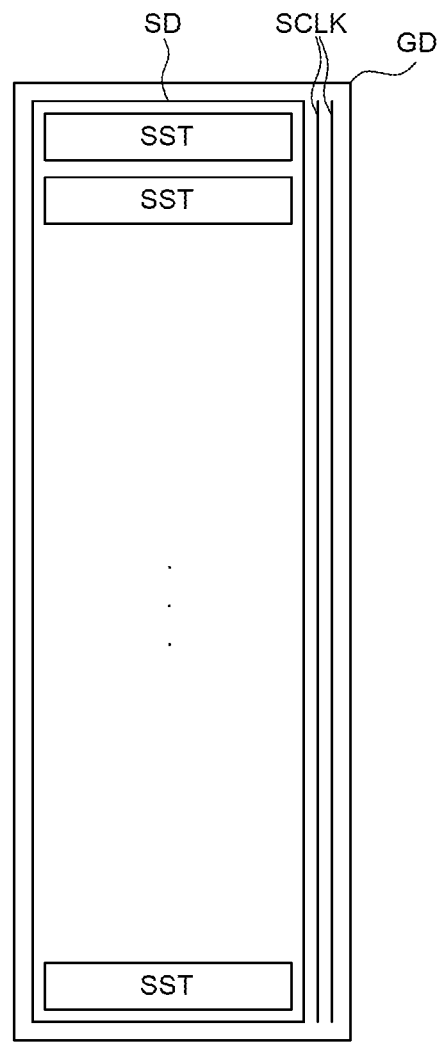
FIG. 3A is a schematic view of a gate driver of a display apparatus according to an embodiment of the present disclosure.

FIG. 3A is a schematic view of a gate driver of a display apparatus according to an embodiment of the present disclosure.

Referring to FIG. 3A, the gate driver GD may include a scan driver SD and a plurality of scan clock lines SCLK. At this time, the scan driver SD may include a plurality of scan stages SST.

The scan driver SD may output a scan signal to a plurality of scan lines which is one type of gate lines. The scan driver SD receives various clock signals, a gate high voltage, and a gate low voltage from the plurality of scan clock lines SCLK to output a scan signal. The scan driver SD may include a plurality of scan stages SST and the plurality of scan stages SST may output the scan signal.

Even though only the scan clock line SCLK is illustrated in FIG. 3A, the present disclosure is not limited thereto and a start pulse line, a gate high voltage line, and a gate low voltage line driving the scan driver SD may be further disposed.

Even though in FIG. 3A, it is described that the gate driver GD includes only the scan driver SD and the scan clock line SCLK, the gate driver may further include an emission driver and an emission clock line which additionally output a light emitting signal.

Hereinafter, FIG. 3B will be referenced together for more detailed description for a plurality of scan stages SST included in the scan driver SD. Although the schematic view of FIG. 3A illustrates as if all of the scan stages SST have a same area size from a plan view, FIG. 3B will illustrate that each of the scan stages can have various different area size seen from a plan view.

Figure 3B:
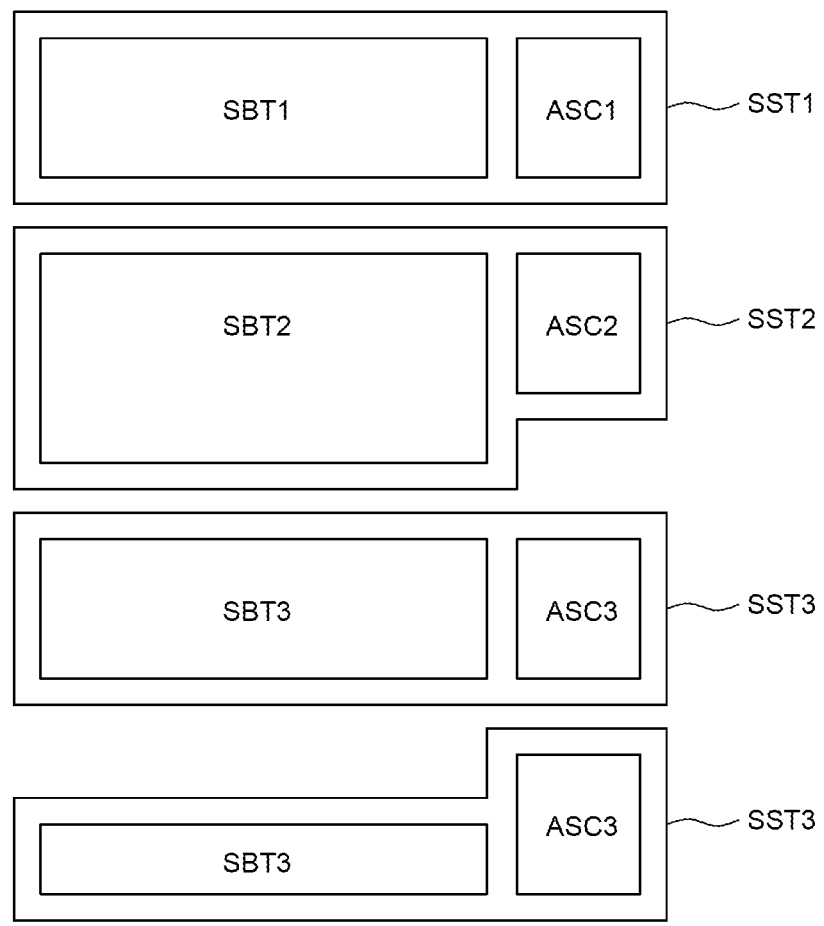
FIG. 3B is a schematic view of a plurality of scan stages of a scan driver of a gate driver of a display apparatus according to an embodiment of the present disclosure.

FIG. 3B is a schematic view of a plurality of scan stages of a scan driver of a gate driver of a display apparatus according to an embodiment of the present disclosure.

First, each of the plurality of scan stages SST (e.g., a first scan stage SST1, a second scan stage SST2, and a third scan stage SST3) includes a scan circuit to output a scan signal. The scan circuit may be configured by various transistors or configured by various transistors and capacitors. At this time, the scan circuit may include a scan buffer transistor SBT (e.g., a first scan buffer transistor SBT1, a second scan buffer transistor SBT2, and a third scan buffer transistor SBT3) and an additional scan circuit ASC excluding the scan buffer transistor SBT. That is, the remaining components of the scan circuit excluding the scan buffer transistor SBT may be defined as an additional scan circuit ASC (e.g., first additional scan circuit ASC1, second additional scan circuit ASC2, and third additional scan circuit ASC3). At this time, the scan buffer transistor SBT may be a transistor having a largest size in area in a plan view (or largest area size in a plan view), among all transistors included in the scan circuit and a scan signal may be output from an output terminal of the scan buffer transistor SBT. Namely, the footprint area of the SBT transistor is larger than that of the ASC transistor in some locations in the circuit and some embodiments. At this time, the scan buffer transistor SBT includes a first scan buffer transistor SBT1 and a second scan buffer transistor SBT2 which are normal output scan buffer transistors and a third scan buffer transistor SBT3 which is a dummy scan buffer transistor. The first scan buffer transistor SBT1 and the second scan buffer transistor SBT2 are disposed in a first scan stage SST1 and a second scan stage SST2 which are normal output scan stages to normally output a signal. The third scan buffer transistor SBT3 is disposed in a third scan stage SST3 which is a dummy output scan stage and does not normally output a signal. Further, the additional scan circuit ASC includes a first additional scan circuit ASC1 and a second additional scan circuit ASC2 disposed in the first scan stage SST1 and the second scan stage SST2 and a third additional scan circuit ASC3 disposed in the third scan stage SST3. In some embodiments, the first scan stage SST1 includes a first additional scan circuit ASC1 adjacent and coupled to the first scan buffer transistor SBT1, the second scan stage SST2 includes a second additional scan circuit ASC2 adjacent and coupled to the second scan buffer transistor SBT2, the third scan stage SST3 includes a third additional scan circuit ASC3 adjacent and coupled to the third scan buffer transistor SBT3. The first additional scan circuit ASC1, the second additional scan circuit ASC2, and the third additional scan circuit ASC3 have a same area from a plan view.

The plurality of scan stages SST includes a plurality of first scan stages SST1, a plurality of second scan stages SST2, and a plurality of third scan stages SST3. In FIG. 3B, only one first scan stage SST1 among the plurality of first scan stages SST1, one second scan stage SST2, and two different-shaped third scan stages SST3 among the plurality of third scan stages SST3 are illustrated.

The plurality of first scan stages SST1 and the plurality of second scan stages SST2 may be normal output scan stages which normally output the scan signal. The plurality of third scan stages SST3 may be dummy scan stages which do not normally output the scan signal. The first scan stage SST1 may include a first scan buffer transistor SBT1 and a first additional scan circuit ASC1. The second scan stage SST2 may include a second scan buffer transistor SBT2 and a second additional scan circuit ASC2. The third scan stage SST3 may include a third scan buffer transistor SBT3 and a third additional scan circuit ASC3. At this time, the first additional scan circuit ASC1, the second additional scan circuit ASC2, and the third additional scan circuit ASC3 may be the same. Further, the first scan buffer transistor SBT1, the second scan buffer transistor SBT2, and the third scan buffer transistor SBT3 may be functionally the same. However, the third scan buffer transistor SBT3 disposed in the third scan stage SST3 which is a dummy scan stage may not output a scan signal.

In the meantime, the plurality of first scan stages SST1 and the plurality of second scan stages SST2 which are normal output scan stages may have different sizes seen from a plan view. The first scan stage SST1 is connected to the first gate line GL1 having only a linear portion and the second scan stage SST2 may be connected to the second gate line GL2 having at least a linear portion and at least a curved portion. Therefore, the size of the second scan buffer transistor SBT2 of the second scan stage SST2 may be larger than the size of the first scan buffer transistor SBT1 of the first scan stage SST1. Accordingly, the size of the second scan stage SST2 may be larger than the size of the first scan stage SST1. Here, as one example, the size may refer to an area of the scan stage as seen from a plan view. Namely, this is the area from a top view of that particular stage or structure. This is also referred to as the size of the footprint by some of ordinary skill in the art. The size of the second scan buffer transistor SBT2 of the second scan stage SST2 and the size of the first scan buffer transistor SBT1 of the first scan stage SST1 will be described below in more detail with reference to FIGS. 5 to 7B. The size of the area in plan view of a transistor can be related to the w/l (width/length) ratio of the channel of a particular transistor. A larger w/l ratio of a transistor will generally also have a larger size area in a footprint, namely, a plan view.

Additionally, some of the plurality of third scan stages SST3 and the others may have different sizes. For example, a third scan stage SST3 having a larger size, among the plurality of third scan stages SST3 illustrated in FIG. 3B, may have the same size and the same configuration as the first scan stage SST1, but does not normally output the signal, unlike the first scan stage SST1 and thus the third scan stage SST3 is also referred to as a dummy scan stage. Further, among the plurality of third scan stages SST3 illustrated in FIG. 3B, a third scan stage SST3 having relatively smaller size may have the same configuration as the first scan stage SST1 and the second scan stage SST2. However, the third scan stage SST3 having a smaller size may not normally output a signal, unlike the first scan stage SST1 and the second scan stage SST2 and may have a smaller size than the first scan stage SST1 and the second scan stage SST2. At this time, a size of the third scan buffer transistor SBT3 of the third scan stage SST3 may be smaller than a size of the first scan buffer transistor SBT1 of the first scan stage SST1 and a size of the second scan buffer transistor SBT2 of the second scan stage SST2. The size of the third scan buffer transistor SBT3 of the third scan stage SST3 will be described below in more detail with reference to FIGS. 5 to 7B.

Figure 4:
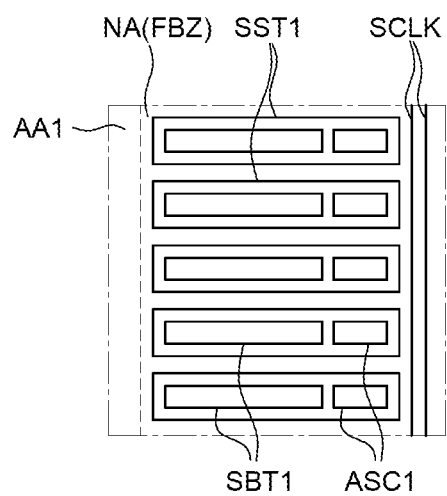
FIG. 4 is a schematic enlarged view of a non-display area at a right side of a display area of a display apparatus according to an embodiment of the present disclosure.
Figure 5:
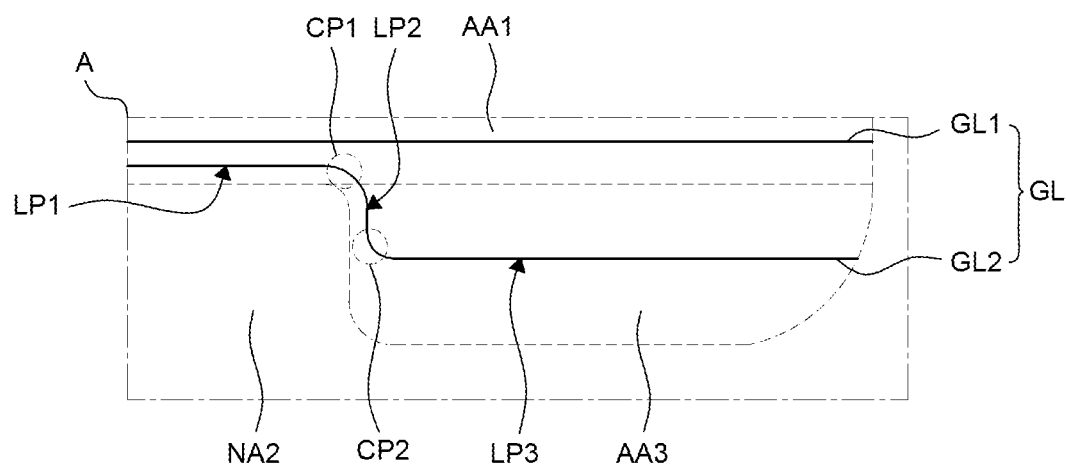
FIG. 5 is an enlarged view of an A area of FIG. 1.
Figure 6:
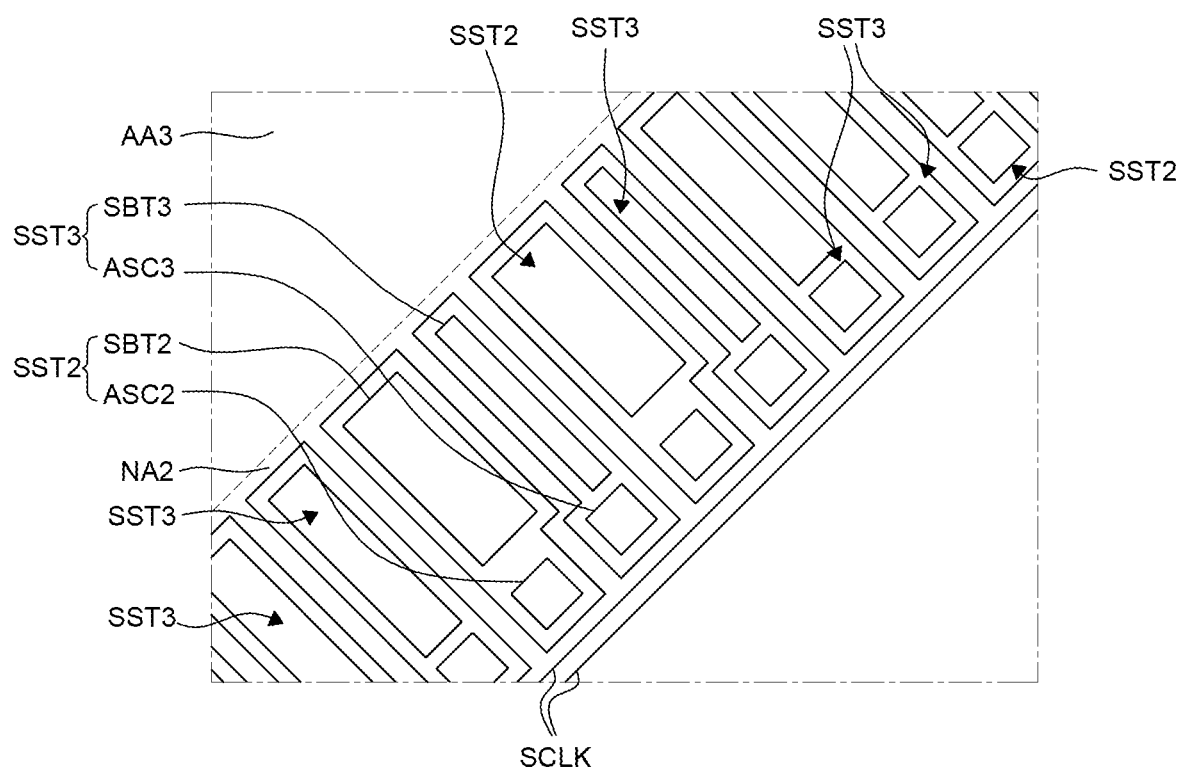
FIG. 6 is a schematic enlarged view of corner areas of a display area and a non-display area of a display apparatus according to an embodiment of the present disclosure.

FIG. 4 is a schematic enlarged view of a non-display area at a right side of a display area of a display apparatus according to an embodiment of the present disclosure. FIG. 5 is an enlarged view of an A area of FIG. 1. FIG. 6 is a schematic enlarged view of corner areas of a display area and a non-display area of a display apparatus according to an embodiment of the present disclosure. For example, FIG. 4 is a schematic view of a non-display area NA disposed at a right side of a first display area AA1 of a display area AA of a display apparatus 100 and illustrates only components for a gate driver GD among various components of the display apparatus 100. In the meantime, even though in FIG. 4, the non-display area NA disposed at the right side of the first display area AA1 has been described, the non-display area NA disposed at the left side of the second display area AA2 is also bisymmetrically disposed so that the same description may be applied. Further, even though in FIG. 6, a partial area in which only the second gate line GL2 is disposed in a corner area disposed at a right lower end, among a plurality of corner areas of the display area AA, has been described, the same description may be applied to the other corner area. For the convenience of description, in FIG. 5, among various components of the display apparatus 100, only one first gate line GL1 and one second gate line GL2 among a plurality of gate lines GL are illustrated. However, it will be apparent to one of skill in the art, the second gate line GL2 will have some portions that have a curved portion that corresponds to the boundary created between the second non-display area NA2 and the third display area AA3. This will be explained in further detail with relation to FIG. 5.

First, referring to FIG. 5, the plurality of gate lines GL may be disposed to extend from the gate driver GD to the display area AA. The plurality of gate lines GL may include a first gate line GL1 and a second gate line GL2. The first gate line GL1 is a gate line including only a linear portion and the second gate line GL2 is a gate line including at least one linear portion and at least one curved portion. For example, the first gate line GL1 extends straight in a first direction within the display area (in particularly, the first display area AA1 as shown in FIG. 5). The second gate line GL2, on the other hand, includes a first curved portion CP1 between two linear portions, namely a first linear portion LP1 and a second linear portion LP2. The second gate line GL2 also includes a second curved portion CP2 between two linear portions, namely a third linear portion LP3 and the second linear portion LP2. The second linear portion LP2 of the second gate line GL2 extends in a second direction transverse to the first direction within the display area. The one or more linear portions (e.g., LP1 and LP3) of the second gate line GL2 extends in the first direction similar to the first gate line GL1. As shown, the second gate line GL2 may change the direction that it extends at least one time. The second gate line GL2 may include one or more curved portions within the display area. For example, as discussed above, FIG. 5 shows that second gate line GL2 has 2 curved portions in area A. A linear portion (e.g., LP2) also exists between the 2 curved portions as shown in area A. In the illustrated example embodiment, the linear portion between the 2 curved portions extend in a third direction that is perpendicular to the first direction.

Referring to FIG. 5, the first gate line GL1 is disposed in the first display area AA1 of the display area AA and the second gate line GL2 is disposed in the second display area AA2 and the third display area AA3 of the display area AA. For example, referring to FIG. 5, the second gate line GL2 linearly extends from the third display area AA3 to the left direction and then has a curved portion which extends along a boundary of the second non-display area NA2 and the third display area AA3 in the vicinity of the boundary of the second non-display area NA2 and the third display area AA3 having a curved shape. Thereafter, a part of the second gate line GL2 is disposed in the first display area AA1 as a straight line and then the second gate line GL2 has a curved portion which extends along a boundary of the second non-display area NA2 and the second display area AA2 in the vicinity of the boundary of the second non-display area NA2 and the second display area AA2 having a curved shape again (e.g., one or more curved portions of the second gate line is curved according to a shape of the non-display area NA2). At this time, the first scan stage SST1 is connected to the first gate line GL1 and the second scan stage SST2 is connected to the second gate line GL2. Therefore, the second scan stage SST2 may be disposed in the non-display area NA corresponding to the corner area of the display area AA, that is, a non-display area NA corresponding to the second display area NA2 and the third display area NA3.

Even though in FIG. 5, for the convenience of description, one first gate line GL1 and one second gate line GL2 are illustrated, a plurality of first gate lines GL1 and a plurality of second gate lines GL2 may be disposed.

Referring to FIG. 4, in the non-display area NA disposed at the right side of the first display area AA1 (which is also referred to a first bezel area FBZ; see FIG. 1), the plurality of first scan stages SST1 among the plurality of scan stages SST and the plurality of scan clock lines SCLK may be disposed. That is, in the first display area AA1, only the first gate line GL1 only having the linear portion is disposed. Therefore, in the non-display area NA disposed at the right side of the first display area AA1 (namely, the first bezel area FBZ), the plurality of first scan stages SST1 which is normal output scan stages normally outputting a scan signal and the plurality of first emission stages EST1 which is normal output emission stages normally outputting a light emitting signal are disposed, but the second scan stage SST2 and the third scan stage SST3 are not disposed. First, the second scan stage SST2 is not disposed because only the first gate line GL1 is disposed in the first display area AA1. Further, the reason why the third scan stage SST3 which is a dummy stage is not disposed is to output a necessary scan signal in a minimum space for an optimal layout design. Accordingly, in the first bezel area FBZ, only the normal output scan stage and not the dummy output scan stage among the plurality of stages is disposed therein. A second bezel area SBZ (see FIG. 1) that is arranged on opposite of the first bezel area FBZ is also going to have like configuration as the first bezel area FBZ. That is, the dummy output scan stage will not be disposed in this area in order to provide optimal layout design of the display device. The plurality of stages are included in the gate driver. The plurality of stages can include a normal output scan stage that outputs a scan signal during operation, and a dummy output scan stage that does not output a scan signal during operation. However, as mentioned, in the first bezel area FBZ and the second bezel area SBZ, the dummy output scan stages are not disposed within these area in order to save space.

Referring to FIG. 6, a boundary of the display area AA and a non-display area NA corresponding to the corner area of the display area AA and a boundary of the third display area AA3 and the second non-display area NA2 may have a curved shape. Therefore, with respect to an area having the same vertical width, a length of the boundary of the display area AA and a non-display area NA corresponding to the corner area of the display area AA may be longer than a length of the boundary of the display area AA and the non-display area NA disposed at the right side of the display area AA. Therefore, with respect to the area having the same vertical width, a number of scan stages SST disposed in the non-display area NA corresponding to the corner area of the display area AA may be larger than a number of scan stages SST disposed in the non-display area NA disposed at the right side of the display area AA.

At this time, with respect to the area having the same vertical width, a number of scan signals output from a gate driver GD corresponding to the corner area of the display area AA may be equal to a number of scan signals output from a gate driver GD disposed in the non-display area NA disposed at the right side of the display area AA. Here, the area illustrated in FIG. 6 illustrates an area in which only the second gate line GL2 is disposed, so that only the second scan stage SST2 connected to the second gate line GL2 is disposed, but the first scan stage SST1 connected to the first gate line GL1 is not disposed. Therefore, with respect to the area having the same vertical width, a number of second scan stages SST2 which is normal output scan stages corresponding to the corner area of the display area AA may be equal to a number of first scan stages SST1 disposed in the non-display area NA disposed at the right side of the display area AA. However, with respect to the area having the same vertical width, a number of scan stages SST and emission stages EST disposed in the non-display area NA corresponding to the corner area of the display area AA may be larger than a number of scan stages SST and emission stages EST disposed in the non-display area NA disposed at the right side of the display area AA. Therefore, in the non-display area NA corresponding to the corner area of the display area AA, the third scan stage SST3 which is a dummy scan stage may be further disposed.

Referring to FIG. 6, in the non-display area NA corresponding to the corner area of the display area AA, the plurality of second scan stages SST2, the plurality of third scan stages SST3, and the plurality of scan clock lines SCLK may be disposed. That is, in the non-display area NA corresponding to the corner area of the display area AA, not only the plurality of second scan stages SST2 which is normal output scan stages normally outputting the scan signal, but also the plurality of third scan stages SST3 which is dummy scan stages which do not normally output the scan signal may be disposed. By doing this, also in a space remaining after disposing the plurality of second scan stages SST2 in the non-display area NA corresponding to the corner area of the display area AA, the plurality of third scan stages SST3 having the same circuit structure is disposed. Therefore, the signal may be transmitted in the scan driver SD and the manufacturing process may be more smoothly performed.

An order of disposing the plurality of second scan stages SST2 and the plurality of third scan stages SST3 disposed in the non-display area NA corresponding to the corner area of the display area AA may be irregular. That is, the number and the position of the plurality of third scan stages SST3 which is disposed in addition to the plurality of second scan stage SST2 may be determined based on a curvature of a boundary between the display area AA and the non-display area NA corresponding to the corner area of the display area AA. Accordingly, as illustrated in FIG. 6, the order of disposing the plurality of second scan stages SST2 and the plurality of third scan stages SST3 may be irregular. However, the present disclosure is not limited thereto, so that the order of disposing the plurality of second scan stages SST2 and the plurality of third scan stages SST3 may be regular.

Referring to FIG. 6, the third scan stage SST3 may be a previous stage or a subsequent stage of the second scan stage SST2. That is, in the drawing, the third scan stage SST3 may be disposed to be adjacent to the second scan stage SST2.

Between the second scan stages SST2 and the third scan stages SST3 which are adjacent to each other, a third scan stage SST3 which is relatively smaller may have a different size. Specifically, the size of the second scan buffer transistor SBT2 of the second scan stage SST2 may be larger than the size of the third scan buffer transistor SBT3 of the third scan stage SST3 having a relatively smaller size, among the third scan stages SST3. Therefore, the second scan stage SST2 may be larger than the third scan stage SST3 having a relatively smaller size, among the third scan stages SST3. However, a size of the second additional scan circuit ASC2 of the second scan stage SST2 may be equal to a size of a third additional scan circuit ASC3 of the third scan stage SST3 having a relatively smaller size among the third scan stages SST3. Therefore, a portion protruding from the second scan stage SST2 may be disposed in a concave portion of the third scan stage SST3 having a relatively smaller size among the third scan stages SST3.

Hereinafter, the effect of the display apparatus 100 according to the embodiment of the present disclosure will be described with reference to FIGS. 7A and 7B together.

Figure 7A:
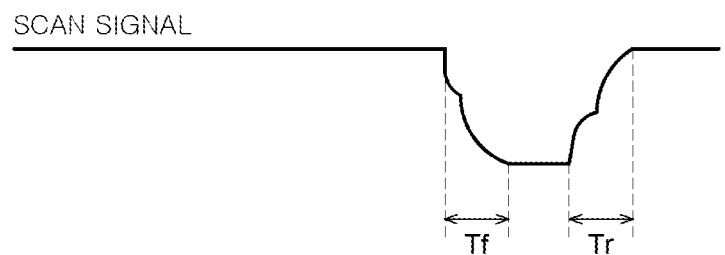
FIGS. 7A and 7B are waveforms of scan signals of display apparatuses according to a Comparative embodiment and an embodiment of the present disclosure.
Figure 7B:
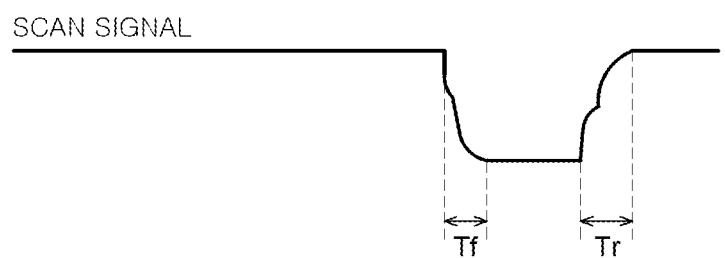

FIGS. 7A and 7B are waveforms of scan signals of display apparatuses according to a Comparative embodiment and an embodiment of the present disclosure. Specifically, FIG. 7B is a waveform for a scan signal which is transmitted through the second gate line GL2 in the display apparatus 100 according to the embodiment of the present disclosure. FIG. 7A is a waveform for a scan signal transmitted through the second gate line GL2 in a Comparative embodiment. According to the Comparative embodiment, unlike the display apparatus 100 according to the embodiment of the present disclosure, the scan stages SST connected to the first gate line GL1 and the second gate line GL2, respectively, have the scan buffer transistors SBT having the same size.

In the case of the display apparatus having a notch structure as described above, a variation in lengths of the first gate line and the second gate line occurs. That is, the first gate line has only the linear portion, but the second gate line has both the curved portion and the linear portion. That is, the curved portion of the second gate line is disposed along a curved shape of the notch structure so that the second gate line has a shape which detours with a curved shape more than the first gate line. Therefore, a length of the second gate line may be longer than a length of the first gate line. As described above, when the length of the second gate line is increased, a resistance of the second gate line is increased, which increases RC delay of the scan signal transmitted through the second gate line. Accordingly, RC delay variation between the scan signal transmitted through the second gate line and the scan signal transmitted through the first gate line may be caused.

However, as in Comparative embodiment, when scan buffer transistors of the scan stages connected to the first gate line and the second gate line have the same size, a falling time Tf and a rising time Tr of the scan signal transmitted through the second gate line are increased, which causes a difficulty to ensure a sampling time. Further, a falling time and a rising time of the scan signal transmitted through the second gate line are longer than a falling time and a rising time of the scan signal transmitted through the first gate line, so that there may be a problem in that a spot is generated in an area where the second gate line is disposed.

Therefore, in the display apparatus 100 according to an embodiment of the present disclosure, a size of the second scan stage SST2 connected to the second gate line GL2 is increased to be larger than a size of the first scan stage SST1 connected to the first gate line GL1. By doing this, RC delay variation between the scan signal transmitted through the first gate line GL1 and the scan signal transmitted through the second gate line GL2 may be reduced. That is, the size of the second scan buffer transistor SBT2 of the second scan stage SST2 connected to the second gate line GL2 having a larger resistance is increased to reduce a load of the second scan stage SST2. Therefore, the RC delay of the scan signal transmitted through the second gate line GL2 which is increased in accordance with the increase of the resistance of the second gate line GL2 may be reduced. At this time, even though the size of the third scan buffer transistor SBT3 of the third scan stage SST3 is reduced, the third scan stage SST3 is a dummy stage so that the reduction of the size of the third scan buffer transistor SBT3 does not affect the performance of the gate driver GD. Accordingly, in the display apparatus 100 according to the embodiment of the present disclosure, the size of the second scan buffer transistor SBT2 of the second scan stage SST2 is increased to be larger than the size of the first scan buffer transistor SBT1 of the first scan stage SST1. By doing this, the RC delay of the scan signal transmitted through the second gate line GL2 may be reduced. As a result, the RC delay variation between the scan signal transmitted through the first gate line GL1 and the scan signal transmitted through the second gate line GL2 is reduced, and the problem of the spot is also improved.

In one embodiment, an area of the third stage SST3 is equal to or smaller than one of the first stage SST1 and the second stage SST2 that normally output a signal. As previously described, the third scan stage SST3 is a dummy stage. Accordingly, the reduction or increase of an area of the third scan stage SST3 as seen from a plan view does not necessarily affect the performance of the third scan stage SST3. The third scan stage SST3 and other dummy stages may be utilized to achieve optimal layout design.

Figure 8:
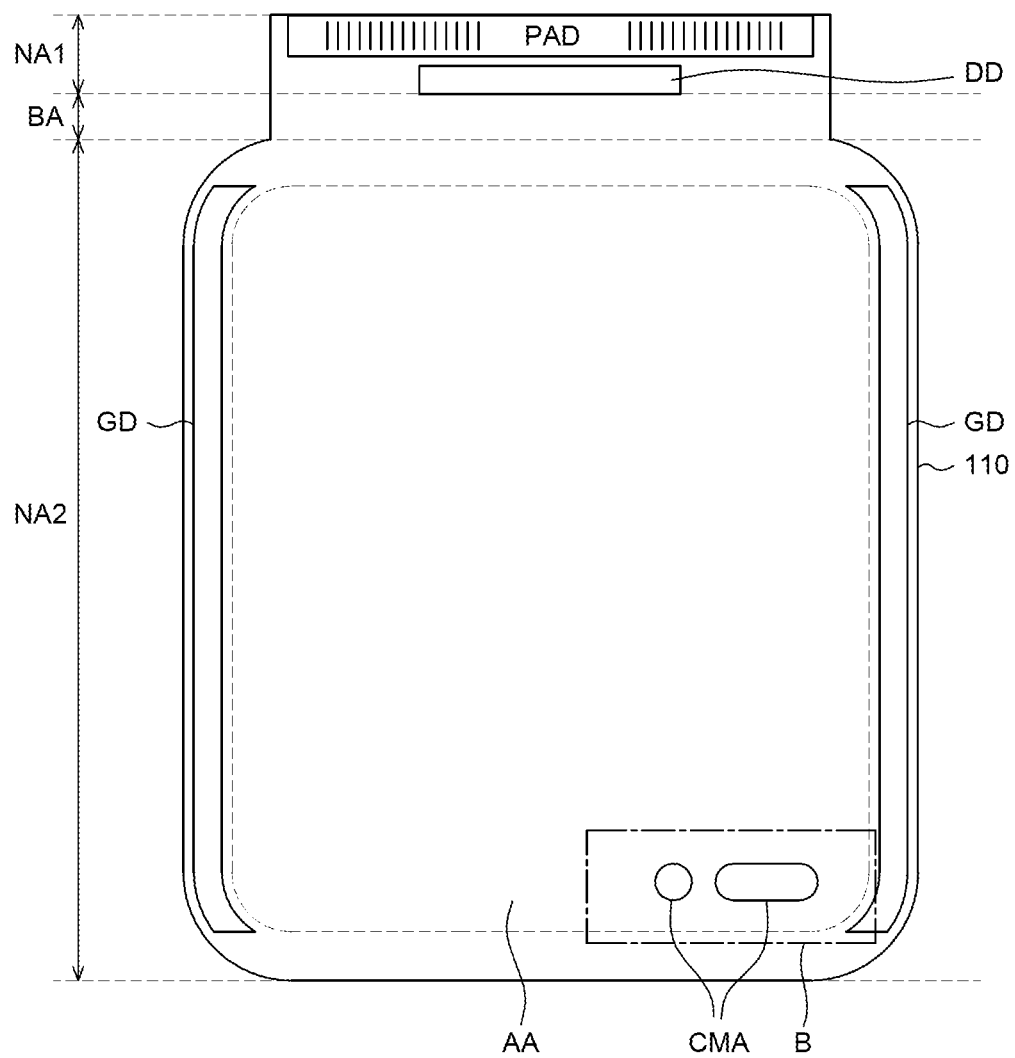
FIG. 8 is a schematic plan view of a display apparatus according to another embodiment of the present disclosure.
Figure 9:
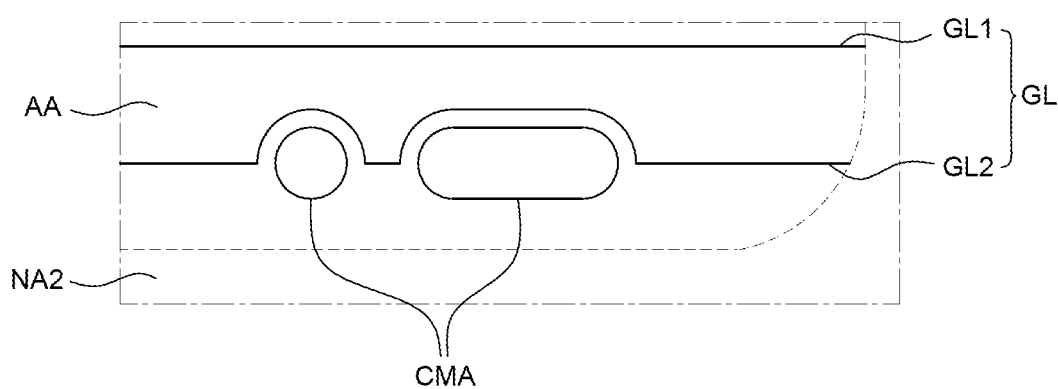
FIG. 9 is an enlarged view of an area B of FIG. 8.

FIG. 8 is a schematic plan view of a display apparatus according to another embodiment of the present disclosure. FIG. 9 is an enlarged view of an area B of FIG. 8. A display apparatus 200 of FIGS. 8 and 9 is substantially the same as the display apparatus 100 of FIGS. 1 to 6 except that the display apparatus 200 further includes a camera area CMA so that a redundant description will be omitted.

Referring to FIGS. 8 and 9, a camera area CMA is disposed in the display area AA. The camera area CMA in which a camera is disposed is disposed in the display area AA. Therefore, in the camera area CMA, the image is not actually displayed. The camera area CMA may be disposed so as to correspond to some of the plurality of corner areas of the display area AA, that is, a lower corner area. An outline of the camera area CMA may include a curved shape as illustrated in FIGS. 8 and 9, but is not limited thereto.

A plurality of gate lines GL may be disposed to extend from the gate driver GD to the display area AA. The plurality of gate lines GL may include a first gate line GL1 and a second gate line GL2. The first gate line GL1 is a gate line including only a linear portion and the second gate line GL2 is a gate line including a linear portion and a curved portion. The first gate line GL1 is disposed in a region of the display area AA in which the camera area CMA is not disposed. The linear portion of the second gate line GL2 is disposed in the display areas AA on at least one or more sides of the camera area CMA among the display areas AA. The curved portion of the second gate line GL2 is a line disposed along a boundary of the camera area CMA and the display area AA, that is, an outline of the camera area CMA. For example, referring to FIG. 9, the second gate line GL2 linearly extends from a right end of the display area AA to the left direction and has a curved portion which detours along the outline of the camera area CMA having a curved shape. At this time, the first scan stage SST1 is connected to the first gate line GL1 and the second scan stage SST2 is connected to the second gate line GL2. Therefore, the second scan stage SST2 may be disposed in the camera area CMA and a non-display area NA corresponding to the corner area of the display area AA.

Even though in FIG. 9, for the convenience of description, one first gate line GL1 and one second gate line GL2 are illustrated, a plurality of first gate lines GL1 and a plurality of second gate lines GL2 may be disposed.

Therefore, in the display apparatus 200 according to another embodiment of the present disclosure, a size of the second scan stage SST2 connected to the second gate line GL2 which detours the camera area CMA is increased to be larger than a size of the first scan stage SST1 connected to the first gate line GL1. By doing this, RC delay variation between the scan signal transmitted through the first gate line GL1 and the scan signal transmitted through the second gate line GL2 may be reduced. That is, the size of the second scan buffer transistor SBT2 of the second scan stage SST2 connected to the second gate line GL2 having a larger resistance due to the longer length is increased to reduce a load of the second scan stage SST2. Therefore, the RC delay of the scan signal transmitted through the second gate line GL2 which is increased in accordance with the increase of the resistance of the second gate line GL2 may be reduced. Accordingly, in the display apparatus 200 according to another embodiment of the present disclosure, the size of the second scan buffer transistor SBT2 of the second scan stage SST2 is increased to be larger than the size of the first scan buffer transistor SBT1 of the first scan stage SST1 to reduce the RC delay of the scan signal transmitted through the second gate line GL2. Therefore, the RC delay variation between the scan signal transmitted through the first gate line GL1 and the scan signal transmitted through the second gate line GL2 may be reduced and the problem of the spot may be improved.

Figure 10:
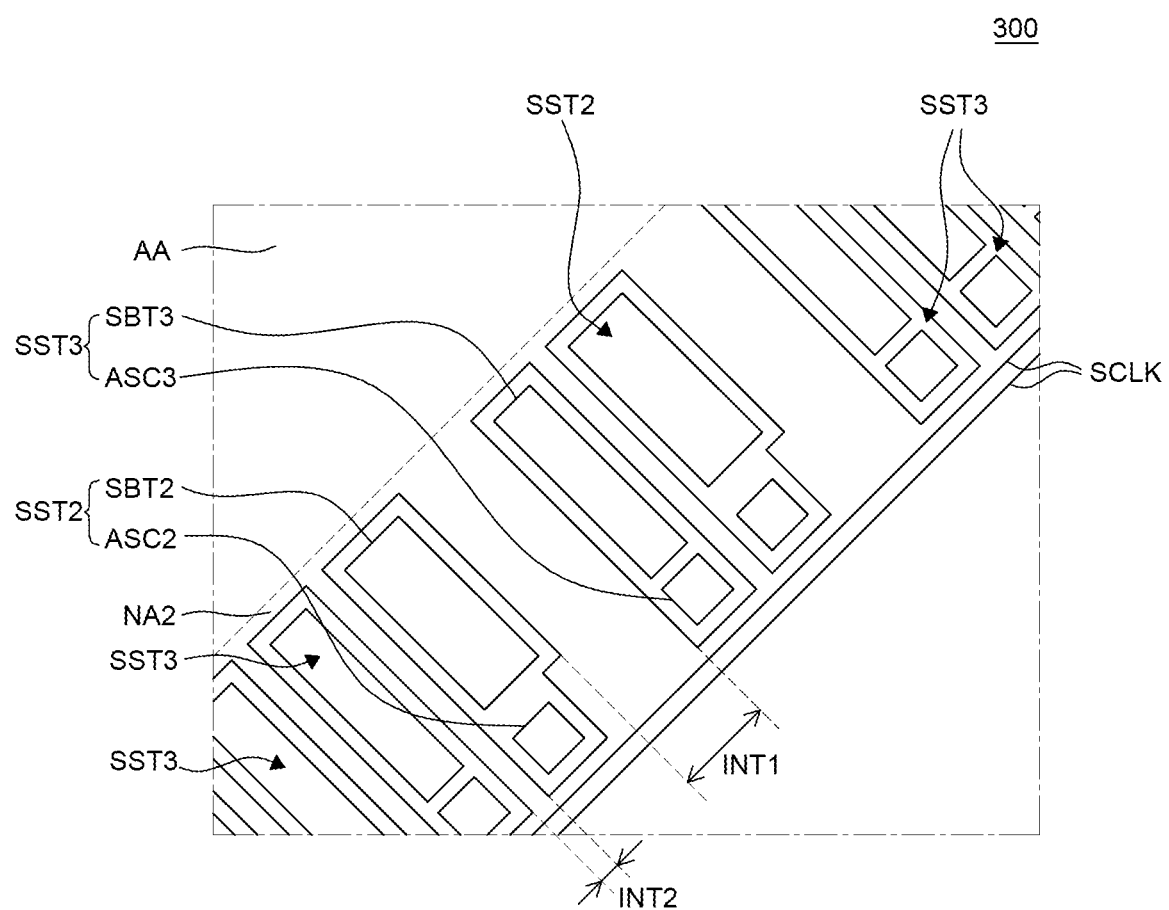
FIG. 10 is a schematic enlarged view of a display apparatus according to still another embodiment of the present disclosure.

FIG. 10 is a schematic enlarged view of a display apparatus according to another embodiment of the present disclosure. The only difference between a display apparatus 300 of FIG. 10 and the display apparatus 100 of FIGS. 1 to 6 is a plurality of scan stages SST, but other configuration is substantially the same, so that a redundant description will be omitted.

Referring to FIG. 10, an interval of a second scan stage SST2 and a previous stage of the second scan stage SST2 may be different from an interval of the second scan stage SST2 and a subsequent stage of the second scan stage SST2. For example, an interval INT1 between the second scan stage SST2 including a second scan buffer transistor SBT2 having a larger size and a previous stage SST3 disposed in a protruding direction of the second scan stage SST2 may be larger than an interval INT2 between the second scan stage SST2 and a subsequent stage SST3 disposed in a direction that the second scan stage SST2 does not protrude. That is, a third scan stage SST3 which is a dummy stage disposed in the protruding direction of the second scan stage SST2 is not disposed to more easily design the second scan buffer transistor SBT2 of the second scan stage SST2.

In the display apparatus 300 according to another embodiment of the present disclosure, a size of the second scan stage SST2 connected to the second gate line GL2 which detours the notch structure is increased to be larger than a size of the first scan stage SST1 connected to the first gate line GL1. By doing this, RC delay variation between the scan signal transmitted through the first gate line GL1 and the scan signal transmitted through the second gate line GL2 may be reduced. Therefore, the RC delay variation between the scan signal transmitted through the first gate line GL1 and the scan signal transmitted through the second gate line GL2 may be reduced and the problem of the spot may be improved.

Further, in the display apparatus 300 according to another embodiment of the present disclosure, an interval between the second scan stage SST2 and a previous stage disposed in a protruding direction of the second scan stage SST2 may be larger than an interval between the second scan stage SST2 and a subsequent stage disposed in a direction that the second scan stage SST2 does not protrude. That is, in the display apparatus 300 according to another embodiment of the present disclosure, the third scan stage SST3 which is a dummy stage disposed in the protruding direction of the second scan stage SST2 is not disposed to easily design the second scan buffer transistor SBT2 of the second scan stage SST2. Accordingly, the RC delay of the scan signal transmitted by the second gate line GL2 may be more efficiently reduced.

Embodiments of the present disclosure can also be described as follows.

A display apparatus according to an aspect of the present disclosure may comprise a substrate including a display area and a non-display area adjacent to the display area, a plurality of pixels disposed in the display area, a gate driver disposed on both sides of the display area in the non-display area, the gate driver comprising a plurality of stages including a first stage and a second stage, and a plurality of gate lines extending from the gate driver to the display area, wherein the plurality of gate lines include a first gate line including a linear portion and connected to the first stage, and a second gate line including a linear portion and a curved portion and connected to the second stage, and wherein a size of the second stage may be larger than a size of the first stage.

According to some embodiments of the present disclosure, the display area may include a plurality of corner areas comprising a round shape and the second stage may be disposed in the non-display area corresponding to the plurality of corner areas.

According to some embodiments of the present disclosure, the display area may include a first display area and a second display area and a third display area extending from one portion of the first display area, the non-display area may be disposed between the second display area and the third display area, and the second gate line may be disposed in the second display area and the third display area.

According to some embodiments of the present disclosure, the second display area and the third display area may correspond to some corner areas of the plurality of corner areas, and the second stage may be disposed in a non-display area corresponding to the second display area and the third display area.

According to some embodiments of the present disclosure, a boundary of the second display area and the non-display area, and a boundary of the third display area and the non-display area may have a curved shape, and a curved portion of the second gate line may be disposed along the boundary of the second display area and the non-display area and the boundary of and the third display area and the non-display area.

According to some embodiments of the present disclosure, the display apparatus may further comprise a camera area in the display area, wherein the second gate line may be disposed in the display area on at least one or more sides of the camera area.

According to some embodiments of the present disclosure, the camera area may correspond to some corner areas of the plurality of corner areas, and the second stage may be disposed in the non-display area corresponding to the camera area.

According to some embodiments of the present disclosure, an outline of the camera area may include a curved shape and the curved portion of the second gate line may be disposed along a boundary of the camera area.

According to some embodiments of the present disclosure, each of the plurality of stages may include a buffer transistor and a size of the buffer transistor of the second stage may be larger than a size of the buffer transistor of the first stage.

According to some embodiments of the present disclosure, the plurality of stages further may comprise a third stage, the first stage and the second stage are stages which normally output signals, the third stage may be a dummy stage which does not output a signal, and the third stage may be a previous stage or a subsequent stage of the second stage.

According to some embodiments of the present disclosure, a size of the third stage may be smaller than a size of the first stage and a size of the second stage.

According to some embodiments of the present disclosure, a size of the buffer transistor of the third stage may be smaller than a size of the buffer transistor of the first stage and a size of the buffer transistor of the second stage.

According to some embodiments of the present disclosure, an interval between the second stage and a previous stage of the second stage may be different from an interval between the second stage and a subsequent stage of the second stage.

It will be apparent to those skilled in the art that various modifications and variations can be made in the present disclosure without departing from the technical idea or scope of the disclosures. Thus, it may be intended that the embodiments of present disclosure cover the modifications and variations of the disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
a substrate including a display area and a non-display area adjacent to the display area;
a plurality of pixels disposed in the display area;
a gate driver disposed on both sides of the display area in the non-display area, the gate driver including a plurality of stages including a first stage and a second stage; and
a plurality of gate lines extending from the gate driver to the display area,
wherein the plurality of gate lines includes a first gate line including a linear portion and coupled to the first stage, and a second gate line including a linear portion and a curved portion and coupled to the second stage,
wherein the first stage includes a first scan buffer transistor and a first additional scan circuit adjacent and coupled to the first scan buffer transistor, the second stage includes a second scan buffer transistor and a second additional scan circuit adjacent and coupled to the second scan buffer transistor, and
wherein a size of an area of the second stage including the second additional scan circuit and the second scan buffer transistor is larger than a size of an area of the first stage including the first additional scan circuit and the first scan buffer transistor from a plan view.

2. The display apparatus of claim 1, wherein the display area includes a plurality of corner areas comprising a round shape and the second stage is disposed in the non-display area corresponding to the plurality of corner areas.

3. The display apparatus of claim 2, wherein the display area includes a first display area and a second display area and a third display area extending from one portion of the first display area, the non-display area is disposed between the second display area and the third display area, and the second gate line is disposed in the second display area and the third display area.

4. The display apparatus of claim 3, wherein the second display area and the third display area correspond to some corner areas of the plurality of corner areas, and the second stage is disposed in a non-display area corresponding to the second display area and the third display area.

5. The display apparatus of claim 3, wherein a boundary of the second display area and the non-display area, and a boundary of the third display area and the non-display area comprise a curved shape, and a curved portion of the second gate line is disposed along the boundary of the second display area and the non-display area and the boundary of the third display area and the non-display area.

6. The display apparatus of claim 2, further comprising:
a camera area in the display area,
wherein the second gate line is disposed in the display area on at least one or more sides of the camera area.

7. The display apparatus of claim 6, wherein the camera area corresponds to some corner areas of the plurality of corner areas, and the second stage is disposed in the non-display area corresponding to the camera area.

8. The display apparatus of claim 6, wherein an outline of the camera area includes a curved shape and the curved portion of the second gate line is disposed along a boundary of the camera area.

9. The display apparatus of claim 1, wherein each of the plurality of stages includes a buffer transistor and an area size of the buffer transistor of the second stage is larger than an area size of the buffer transistor of the first stage.

10. The display apparatus of claim 9, wherein the plurality of stages further comprises a third stage, the first stage and the second stage are stages which normally output signals, the third stage is a dummy stage which does not output a signal, and the third stage is a previous stage or a subsequent stage of the second stage.

11. The display apparatus of claim 10, wherein an area size in plan view of the third stage is smaller than an area size in plan view of the first stage and an area size in plan view of the second stage.

12. The display apparatus of claim 11, wherein an area size in plan view of the buffer transistor of the third stage is smaller than an area size in plan view of the buffer transistor of the first stage and an area size in plan view of the buffer transistor of the second stage.

13. The display apparatus of claim 9, wherein an interval between the second stage and a previous stage of the second stage is different from an interval between the second stage and a subsequent stage of the second stage.

14. A display apparatus, comprising:
a plurality of pixels disposed in a display area;
a gate driver disposed in a non-display area adjacent to the display area, the gate driver including a plurality of stages including a first stage, a second stage, and a third stage adjacent to each other, the first stage including a first scan buffer transistor, the second stage including a second scan buffer transistor, and the third stage including a third scan buffer transistor, the third stage being a dummy output scan stage, and the third scan buffer transistor being a dummy scan buffer transistor; and
a plurality of gate lines extending from the gate driver to the display area, the plurality of gate lines including a first gate line coupled to the first stage, a second gate line coupled to the second stage, and a third gate line coupled to the third stage,
wherein an area of the second stage from a plan view is larger than an area of the first stage,
wherein the first stage includes a first additional scan circuit adjacent and coupled to the first scan buffer transistor, the second stage includes a second additional scan circuit adjacent and coupled to the second scan buffer transistor, the third stage includes a third additional scan circuit adjacent and coupled to the third scan buffer transistor, and
wherein the first additional scan circuit, the second additional scan circuit, and the third additional scan circuit have a same area from a plan view.

15. The display apparatus of claim 14, wherein the first gate line includes only a linear portion within the display area extending in a first direction and the second gate line includes both at least one linear portion and at least one curved portion, the at least one linear portion of the second gate line extending in a second direction transverse to the first direction.

16. The display apparatus of claim 15, wherein the at least one curved portion of the second gate line is curved according to a shape of the non-display area.

17. The display apparatus of claim 14, wherein an area of the third stage is equal to or smaller than one of the first stage and the second stage that output a signal.

18. The display apparatus of claim 14, wherein the first stage, the second stage, and the third stage are not evenly spaced apart from each other.

19. A display apparatus, comprising:
a plurality of pixels disposed in a display area;
a non-display area adjacent to the display area, the non-display area including a first bezel area adjacent to one side of the display area and a second bezel area adjacent to the other side of the display area opposite the first bezel area;
a gate driver disposed in the non-display area, the gate driver including a plurality of stages including:
a normal output scan stage, in operation, output a scan signal; and
a dummy output scan stage, in operation, does not output a scan signal; and
a plurality of gate lines extending from the gate driver to the display area, the plurality of gate lines including a first gate line coupled to a normal output scan stage in the first bezel area,
wherein the first bezel area includes only the normal output scan stage and not the dummy output scan stage among the plurality of stages,
wherein the normal output scan stage includes a first stage including a first scan buffer transistor, a second stage including a second scan buffer transistor,
wherein the dummy output scan stage includes a third stage including a third scan buffer transistor, and
wherein a footprint area of the dummy output scan stage is smaller than a footprint area of the normal output scan stage.

* * * * *